(12) United States Patent
Schott et al.

(10) Patent No.: US 8,564,083 B2
(45) Date of Patent: Oct. 22, 2013

(54) VERTICAL HALL SENSOR AND METHOD FOR PRODUCING A VERTICAL HALL SENSOR

(75) Inventors: Christian Schott, Lussy-sur-Morges (CH); Peter Hofmann, Radeberg (DE)

(73) Assignees: Melexis Technologies NV, Tessenderlo (BE); X-Fab Semiconductor Foundries AG, Erfurt (DE)

( * ) Notice: Subject to any disclaimer, the term of this patent is extended or adjusted under 35 U.S.C. 154(b) by 36 days.

(21) Appl. No.: 13/421,026

(22) Filed: Mar. 15, 2012

(65) Prior Publication Data

US 2012/0241887 A1    Sep. 27, 2012

(30) Foreign Application Priority Data

Mar. 24, 2011 (CH) ......................................... 531/11

(51) Int. Cl.
*H01L 27/22* (2006.01)
(52) U.S. Cl.
USPC ............ 257/427; 257/E43.003; 257/E43.007; 438/3
(58) Field of Classification Search
USPC ................ 257/427, E43.003, E43.007; 438/3
See application file for complete search history.

(56) References Cited

U.S. PATENT DOCUMENTS

| | | | |
|---|---|---|---|
| 5,572,058 A | 11/1996 | Biard | |
| 5,627,398 A | 5/1997 | Zlebir et al. | |
| 7,253,490 B2 | 8/2007 | Oohira | |
| 7,511,484 B2 | 3/2009 | Oohira et al. | |
| 7,872,322 B2 | 1/2011 | Schott et al. | |
| 8,114,684 B2 | 2/2012 | Rocznik et al. | |
| 2006/0097715 A1 | 5/2006 | Oohira et al. | |
| 2010/0219810 A1 | 9/2010 | Rocznik et al. | |
| 2010/0252900 A1* | 10/2010 | Minixhofer et al. | .......... 257/421 |
| 2011/0050210 A1 | 3/2011 | Schrems et al. | |

FOREIGN PATENT DOCUMENTS

| | | |
|---|---|---|
| DE | 102005051306 A1 | 6/2006 |
| DE | 102006017910 A1 | 10/2007 |
| DE | 102009038938 A1 | 3/2011 |
| EP | 1977460 A1 | 10/2008 |
| EP | 2234185 A1 | 9/2010 |
| JP | 2007027515 A | 2/2007 |
| WO | 2010101823 A1 | 9/2010 |

OTHER PUBLICATIONS

Enrico Schurig, Highly Sensitive Vertical Hall Sensors in CMOS Technology, Thesis 3134 (2004), Copyright 2005, Lausanne, EPFL, 2005.
Jovanovic et al, Simulation of Vertical Hall Sensor in High-voltage CMOS Technology, Scientific Publication, Telsiks 2003, Serbia and Montenegro, Nis, Oct. 1-3, 2003.

* cited by examiner

*Primary Examiner* — Jami M Valentine
(74) *Attorney, Agent, or Firm* — McCormick, Paulding & Huber LLP

(57) ABSTRACT

The invention relates to a vertical Hall sensor integrated in a semiconductor chip and a method for the production thereof. The vertical Hall sensor has an electrically conductive well of a first conductivity type, which is embedded in an electrically conductive region of a second conductivity type. The electrical contacts are arranged along a straight line on a planar surface of the electrically conductive well. The electrically conductive well is generated by means of high-energy ion implantation and subsequent heating, so that it has a doping profile which either has a maximum which is located at a depth $T_1$ from the planar surface of the electrically conductive well, or is essentially constant up to a depth $T_2$.

8 Claims, 8 Drawing Sheets

VERTICAL HALL SENSOR AND METHOD FOR PRODUCING A VERTICAL HALL SENSOR

PRIORITY CLAIM

Figure 1:
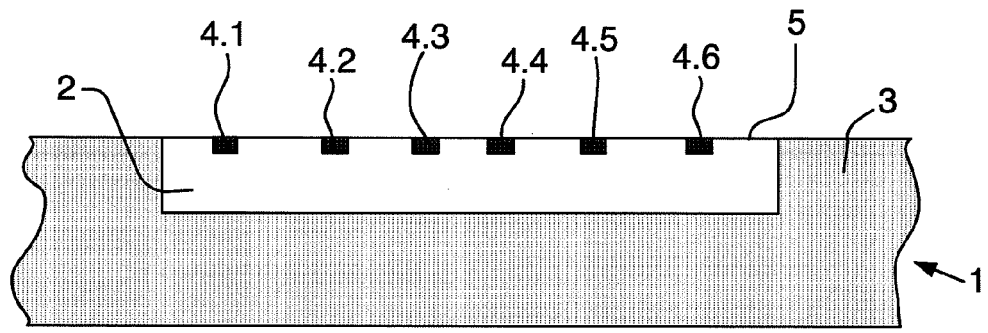

Applicant hereby claims foreign priority under 35 U.S.C §119 from Swiss Application No. 531/11 filed Mar. 24, 2011, the disclosure of which is herein incorporated by reference.

FIELD OF THE INVENTION

The invention relates to a vertical Hall sensor, which is integrated in a semiconductor chip, and a method for producing such a vertical Hall sensor.

BACKGROUND OF THE INVENTION

A vertical Hall sensor is a magnetic field sensor which is sensitive to a magnetic field which extends parallel to the surface of the semiconductor chip. The vertical Hall sensor typically comprises an n-doped well, which has been diffused into a p-doped substrate, or a p-doped well, which has been diffused into an n-doped substrate, the well typically having four or five contacts, which are arranged along a straight line and are located on the surface of the semiconductor chip. Two or three of the four contacts are current contacts which are used for the purpose of causing a current to flow through the vertical Hall sensor, and two of the other contacts are voltage contacts, which are used for the purpose of tapping the Hall voltage, which arises in the presence of a magnetic field that extends perpendicular to the direction of the current.

The most frequently used vertical Hall sensors have four contacts or five contacts or at most six contacts and are sufficiently known from the literature, e.g., from the thesis number 3134 of the Ecole Polytechnique Fédérale de Lausanne by Enrico Schurig, and also from the patent literature, e.g., from U.S. Pat. No. 5,572,058, U.S. Pat. No. 7,872,322, U.S. Pat. No. 7,253,490, U.S. Pat. No. 7,511,484, WO 2010101823. A vertical Hall sensor having more than six contacts is known from US 2010/0133632.

One of the most difficult tasks in the development of the vertical Hall sensors has always been to achieve a high magnetic-field sensitivity, on the one hand, and to keep the so-called offset of the sensor signal, which is the voltage appearing between the voltage contacts in the absence of a magnetic field, as small as possible, on the other hand.

Because of the depth of the well, which is limited by technology to a few micrometers, the contacts must be as close as possible to one another to achieve a high sensitivity. Since typical wells generated by ion implantation and subsequent relatively long diffusion have the highest doping on the surface, however, the main component of the current also flows through the Hall element just below the surface, of course, and is therefore not very effective for generating the Hall voltage, so that the sensitivity is low. In addition, the current pathway between input current contact and output current contact is therefore very short, which has the result that even very small processing tolerances result in a high offset.

A vertical Hall sensor is known from EP 1977460, in which electrically nonconductive regions are arranged between the contacts, which act as barriers, which force the current flowing between the contacts to flow around these barriers into the depth. However, if these barriers are designed as regions having inverted doping, regions free of charge carriers form around them, whose thickness is a function of the respective locally appearing potential difference between the barrier and the surrounding conductive region. Changes of this potential difference cause a change of the geometry of the conductive region. This in turn results in variations of the offset. The offset of the sensor then typically increases with increasing operating voltage and also with increasing ambient temperature.

SUMMARY OF THE INVENTION

The invention is based on the object of developing a vertical Hall sensor whose offset is as small as possible and whose sensitivity is as high as possible.

A vertical Hall sensor integrated in a semiconductor chip has an electrically conductive well of a first conductivity type, which is embedded in an electrically conductive region of a second conductivity type. The vertical Hall sensor has electrical contacts, which are arranged along a straight line on a planar surface of the electrically conductive well, which planar surface extends parallel to a surface of the semiconductor chip accessible for the wiring. According to the invention, the electrically conductive well has a doping profile generated by ion implantation and not by an epitaxy method and the doping profile either has a maximum which is located at a depth T from the planar surface of the electrically conductive well, or is essentially constant or is wavy and is approximately constant averaged over the waves up to a depth T. The value of the depth T is not zero, but is T>0.

According to a first aspect, the doping of the doping profile is preferably less between the planar surface of the electrically conductive well and the depth T in the areas between the contacts than in the areas below the contacts.

According to a second aspect, the doping profile is preferably approximately constant in the areas below the contacts up to the depth T, so that the electrical conductivity in the mentioned areas is greater than in the areas between the contacts.

A method for producing such a vertical Hall sensor comprises the following steps for producing the electrically conductive well:

implanting foreign atoms of a first chemical element in the electrically conductive region of the second conductivity type by means of a high-energy ion implantation in order to generate a doping profile of the foreign atoms which either has a maximum which is located at a depth $T_{1a}$ from the planar surface of the electrically conductive well (with $T_{1a}$>0), or has multiple maxima or is approximately constant up to a depth $T_{2a}$ from the planar surface of the electrically conductive well (with $T_{2a}$>0), and electrically activating the implanted foreign atoms by heating in such a manner that the generated doping profile either has a maximum which is at a depth $T_1 \cong T_{1a}$ or is essentially constant or is wavy and is approximately constant averaged over the waves up to a depth $T_2 \geq T_{2a}$.

The method preferably comprises the following additional step:

implanting foreign atoms of a second chemical element in the region occupied by the electrically conductive well, in order to reduce the doping and therefore the electrical conductivity directly below the planar surface at least in the regions between the contacts.

The method preferably comprises also the following additional step:

implanting foreign atoms of the first chemical element or a third chemical element in the regions occupied by the contacts, in order to increase the doping and therefore the electrical conductivity below the contacts.

BRIEF DESCRIPTION OF THE DRAWING FIGURES

Figure 2:
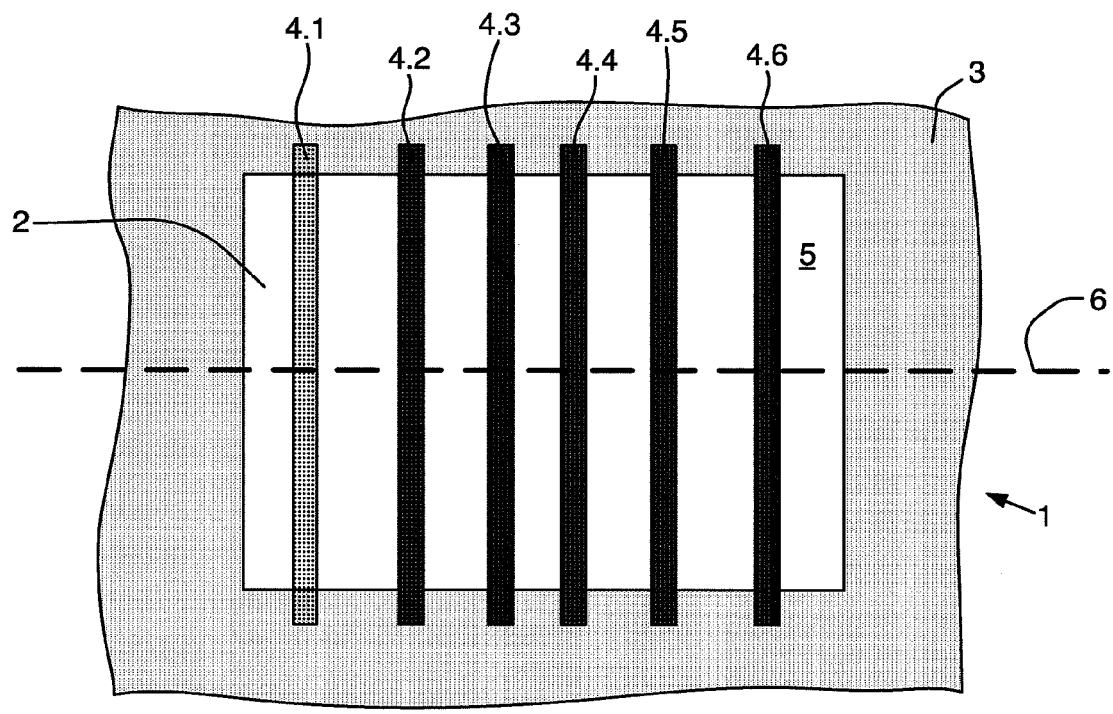
Figure 3:
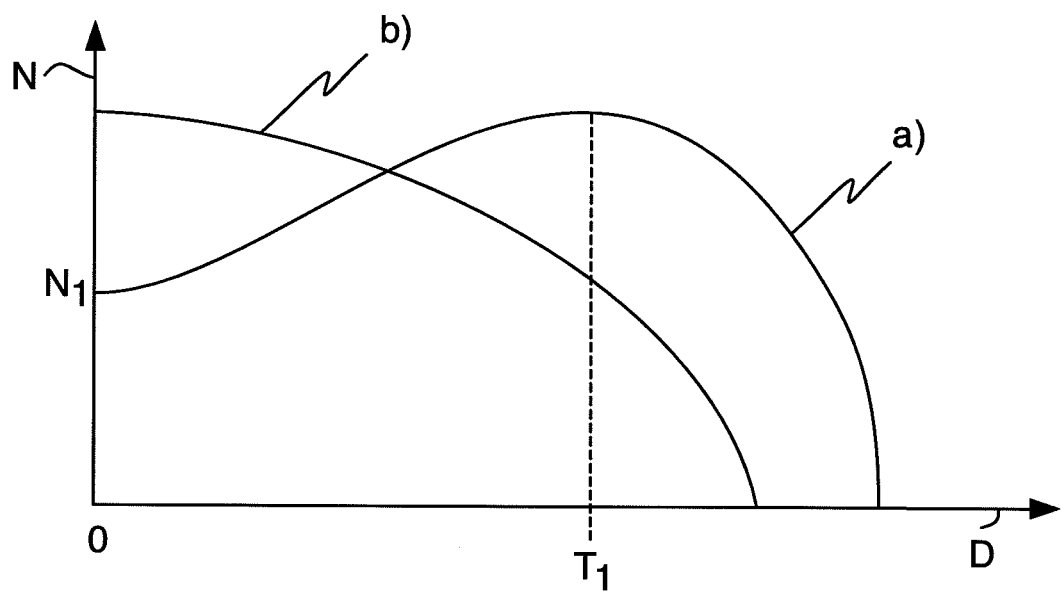
Figure 7A:
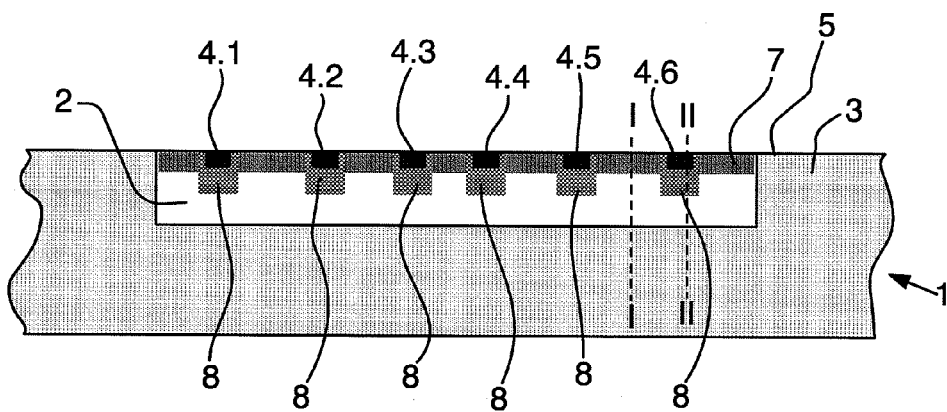
Figure 7B:
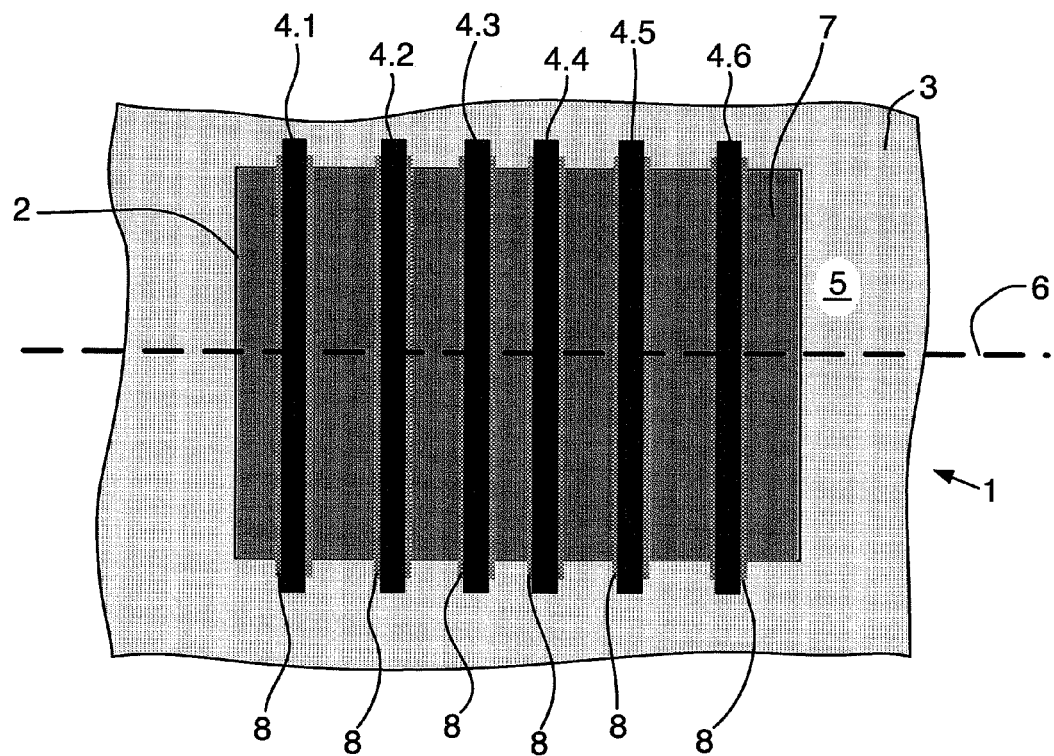
Figure 8:
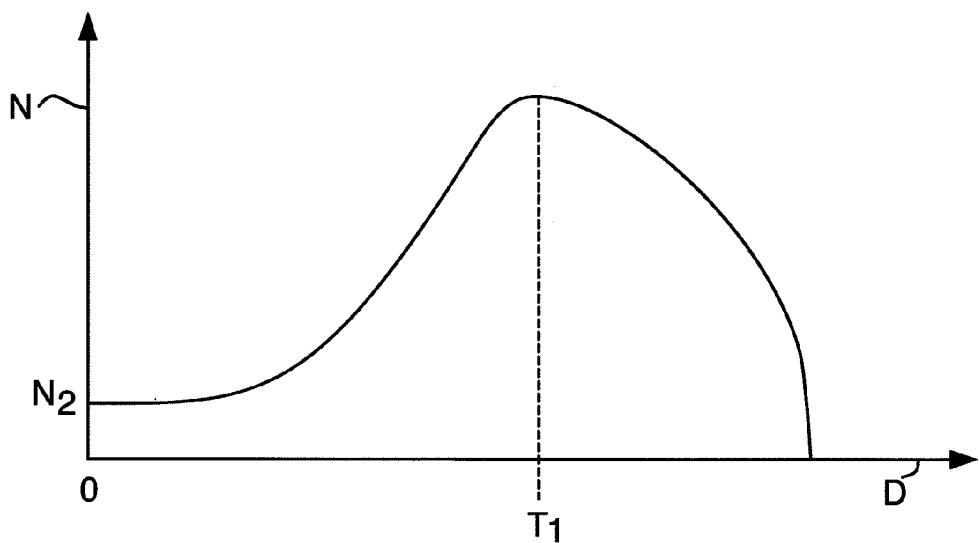
Figure 9:
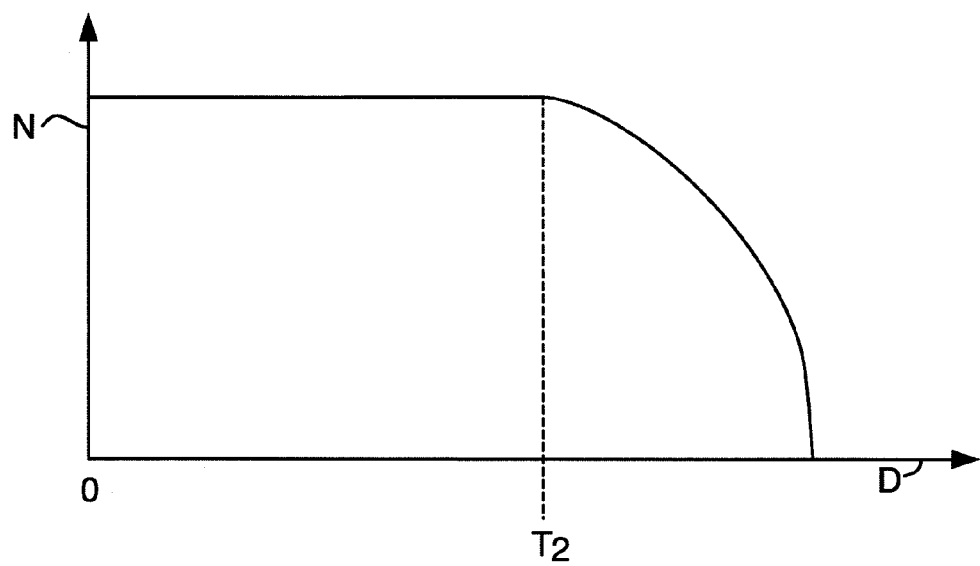
Figure 10:
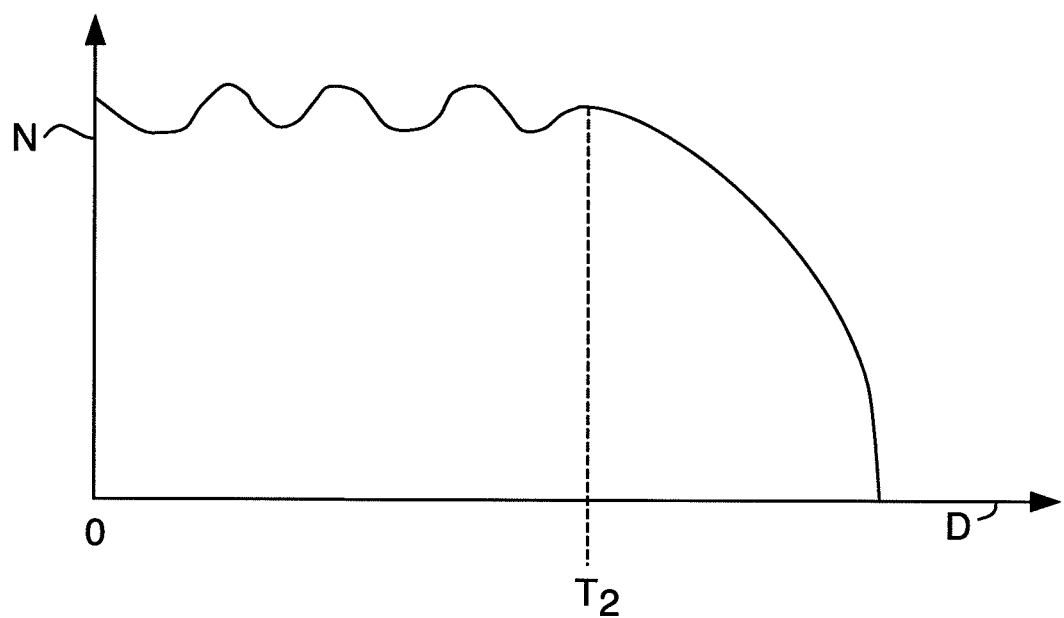

The accompanying drawings, which are incorporated into and constitute a part of this specification, illustrate one or more embodiments of the present invention and, together with the detailed description, serve to explain the principles and implementations of the invention. The figures are not to scale. In the drawings:

FIGS. 1 and 2 schematically show a side view and a top view of a vertical Hall sensor which is integrated in a semiconductor chip, FIG. 3 shows doping profiles, FIGS. 4A to 7B schematically show a side view and a top view of further vertical Hall sensors, and FIGS. 8 to 10 show doping profiles.

DETAILED DESCRIPTION OF THE PREFERRED EMBODIMENTS

FIGS. 1 and 2 schematically show a side view and a top view of a vertical Hall sensor, which is integrated in a semiconductor chip 1. The vertical Hall sensor comprises an electrically conductive well 2 of a first conductivity type, which is embedded in an electrically conductive region 3 of a second conductivity type, and a number n of contacts 4.1 to 4.$n$, which contact the well 2. For the sake of simplicity, the entirety of the contacts 4.1 to 4.$n$ is designated as the contacts 4. The contacts 4 are embedded in a surface 5 of the well 2 and arranged along a straight line 6, the surface 5 of the well 2 being located directly, i.e., only separated by typical oxidation and passivation layers, below the surface of the semiconductor chip 1, which is accessible for the wiring.

The well 2 preferably comprises n-doped semiconductor material and the region 3 comprises p-doped semiconductor material. The well 2 is therefore electrically insulated from the region 3 by a pn-junction. In the example shown, the number n of the contacts 4 is n=6. However, the vertical Hall sensor can also have n=4, n=5, or an even higher number n of contacts 4. The contacts 4 can have equal or also different distances from one another. The contacts 4 are heavily-doped regions of the first conductivity type, which are typically the same width as the well 2, but can also be somewhat wider or somewhat narrower. The Hall sensor is sensitive to a magnetic field which extends parallel to the surface of the semiconductor chip 1 and perpendicular to the straight line 6, and therefore belongs to the class of vertical Hall sensors. The semiconductor chip 1 also contains a plurality of integrated electronic elements (not shown), which form an electronic circuit for the operation of the vertical Hall sensor.

The concept of the well 2 is to be understood in the scope of the description and the claims to mean that the well 2 is a region generated by ion implantation and activation of the implanted foreign atoms by heating, and that the well 2 cannot be produced by an epitaxy method. According to the invention, the well 2 is produced by high-energy ion implantation, in order to achieve the conductivity in the depth is at least as great, preferably greater, as it is close to the surface 5. Therefore, a majority of the current between nonadjacent current contacts flows on an approximately semicircular current pathway around the interposed voltage contact. This provides the following advantages:

a) The length of this semicircular pathway is, considered analytically, $\pi/2=1.57$ times longer than the direct, shortest distance between the current contacts on the surface 5. The influence of distance tolerances is therefore also reduced by this factor and a reduction of the offset is therefore achieved.

b) The Lorentz force, which acts on the charge carriers and causes the Hall effect, is oriented along the entire current pathway precisely in the direction of the voltage contact. The result is an increase of the sensitivity.

c) Tolerances of the lateral edges of the contacts 4 have less influence, since the current flows directly into the depth at the contacts 4.

A well 2, whose electrical conductivity in the depth is at least as great, preferably greater, as it is close to its surface 5, without an epitaxy method being used for its production, can be generated by means of high-energy ion implantation and subsequent heating, for example, by the following steps:

A) implanting foreign atoms of a first chemical element in the electrically conductive region 3 of the second conductivity type by means of a high-energy ion implantation, B) optional step, will be explained later, C) optional step, will be explained later, and D) electrical activation of the implanted foreign atoms by heating.

In silicon-based semiconductor technology, the chemical element phosphorus or arsenic is typically used to generate an n-conducting well in a p-conducting substrate, since phosphorus atoms and arsenic atoms are n-conducting foreign atoms in silicon.

The high-energy ion implantation is preferably performed using an energy in the range from 1 MeV to 2.5 MeV or higher, whereby a depth of the implanted foreign atoms of 3 to 4 µm may be achieved. The high-energy ion implantation generates a doping profile of the foreign atoms which has a maximum located at a distance from the mentioned surface 5. The distance of the maximum of the doping profile of the foreign atoms from the surface 5 is designated herein as the depth $T_{1a}$.

The electrical activation is preferably performed by means of a process known in the technical world as "annealing", for example, by means of so-called "rapid thermal annealing". Such "annealing" is a relatively short-term heating, during which the foreign atoms do not diffuse "far", i.e., typically only to one of the closest lattice spaces of the semiconductor crystal lattice, so that the doping profile of the foreign atoms generated during the implantation in step A does not change or does not change substantially. The high-energy ion implantation and the relatively short-term heating together result in a doping profile of the foreign atoms which has a maximum at the depth $T_1$, wherein $T_1 = T_{1a}$ or at least $T_1 \cong T_{1a}$.

However, the heating can also be dimensioned longer in time, so that a diffusion of the foreign atoms also occurs, in which a part of the foreign atoms diffuses in the direction toward the mentioned surface 5 of the well 2 and a part of the foreign atoms diffuses in the direction away from the mentioned surface 5 of the well 2, and causes the maximum of the doping to disappear and the doping to be essentially approximately constant up to a depth $T_2$.

The resulting doping profile of the well 2 is therefore distinguished in that either more foreign atoms are incorporated in the depth than close to the surface 5 of the semiconductor chip 1 in the semiconductor chip, or the doping of the foreign atoms is essentially constant from the surface 5 up to a certain depth.

FIG. 3 qualitatively shows, with the curve a, the doping profile, or the doping N, of the well 2 as a function of the depth D, i.e., the distance from the surface 5 of the well 2, of a vertical Hall sensor according to the invention, which was generated by the high-energy ion implantation and "annealing", in comparison to the curve b of the doping profile of the well of a vertical Hall sensor according to the prior art. The doping profile of the curve a extends continuously and does not contain an abrupt transition. The doping of the foreign atoms at the surface 5, i.e., at the depth D=0, has a value $N_1$, which is significantly less than the doping of the foreign atoms at the maximum.

The production of the vertical Hall sensor is advantageously expanded with step B and/or both steps B and C, which are described hereafter:

B) Implanting foreign atoms of a second chemical element in the region occupied by the well 2, in order to generate a doping profile of the well 2, whose doping and therefore whose electrical conductivity in the regions between the contacts 4 are further reduced close to the surface 5.

C) Implanting foreign atoms of the first chemical element (or a third chemical element having the same type of conductivity as the first chemical element) in the regions to be occupied or occupied by the contacts 4, in order to generate a doping profile of the well 2 below the contacts 4, which has a higher conductivity up to the depth $T_{1a}$ than the doping profile of the well 2 between the contacts 4.

The doping profile generated using steps A and C is approximately constant in the regions of the contacts 4 up to the depth $T_{1a}$, for example. Step C is also performed by ion implantation, the kinetic energy of the ions in step C being less than in step A, so that the maximum of the doping of the foreign atoms implanted in step C is at a depth $T_{3a}$, which is less than the depth $T_{1a}$.

Steps B and C are preferably performed before step D, so that the heating, in particular the heating in form of "annealing", is performed simultaneously for all foreign atoms.

In silicon-based semiconductor technology, the second chemical element is typically boron, since boron atoms are p-conducting foreign atoms in silicon. Of course, other chemical elements than the mentioned boron, phosphorus, and arsenic can also be used in order to obtain the desired dopings.

Figure 4A:
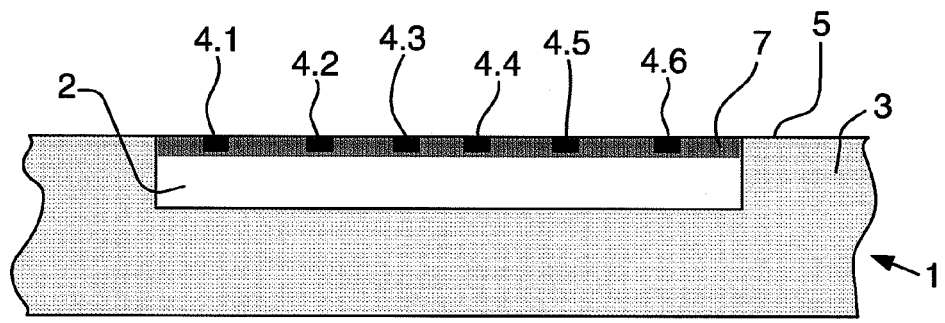
Figure 4B:
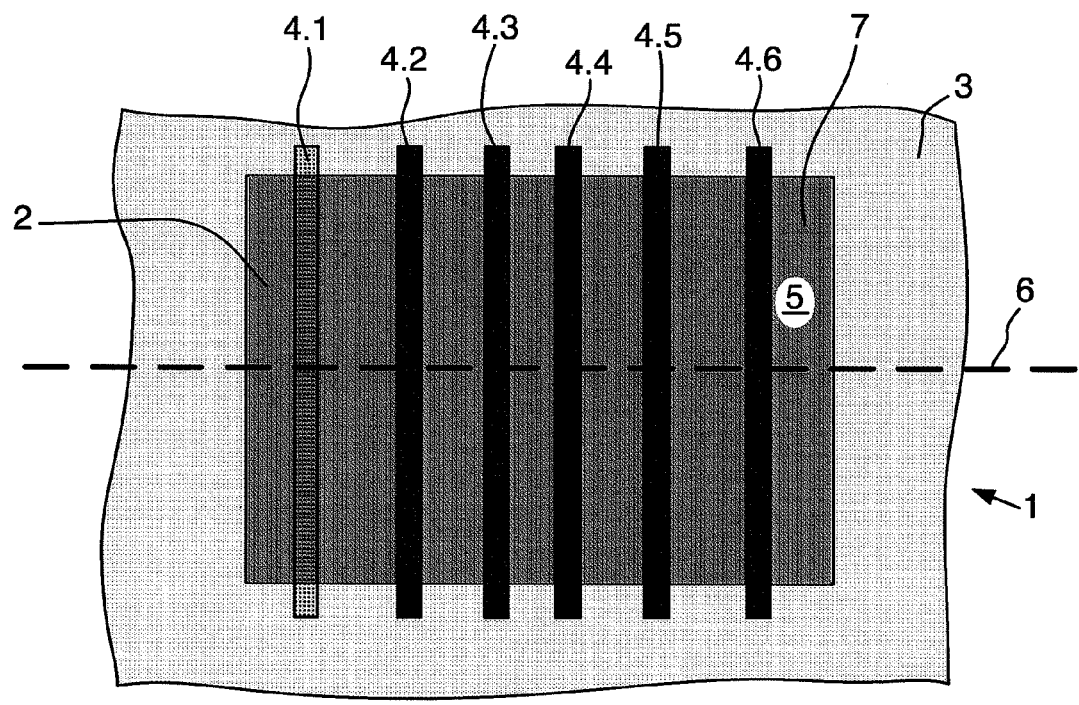
Figure 5A:
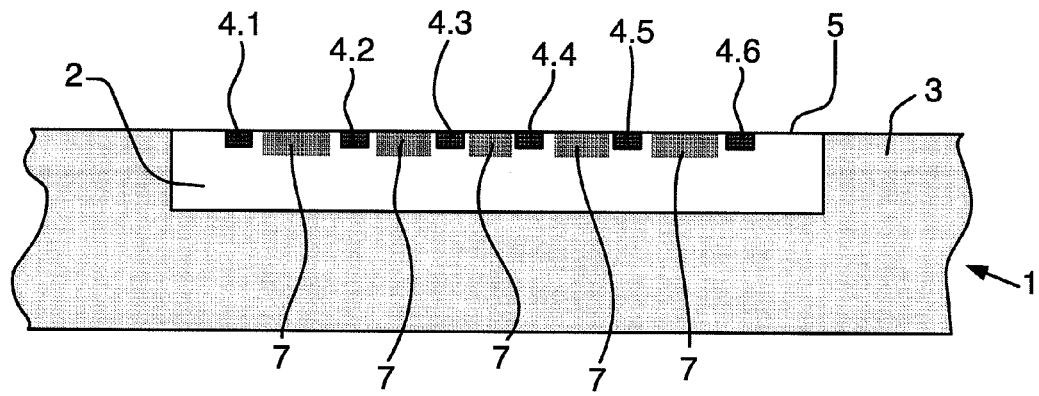
Figure 5B:
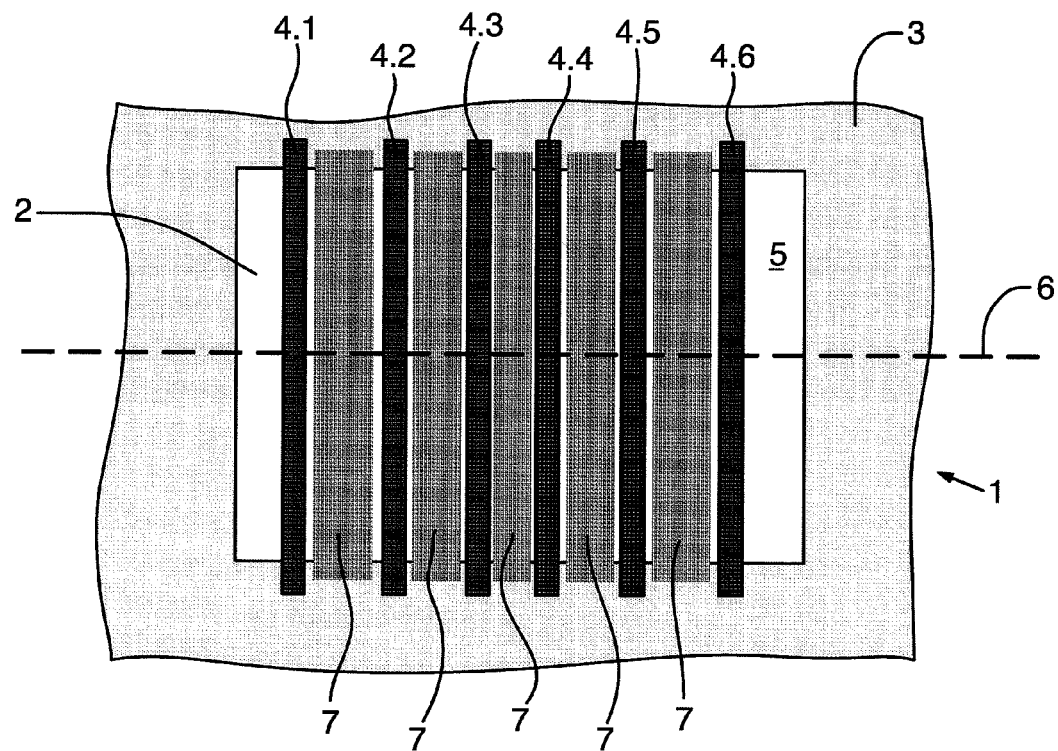

FIGS. 4A, 4B and 5A, 5B illustrate two alternative dopings of the well 2 of the vertical Hall sensor after steps A and B. FIGS. 4A and B illustrate in cross-section and a top view, respectively, the first alternative, in which the implantation of the foreign atoms of the second chemical element was performed without using an implantation mask and therefore in the entire region of the well 2. FIGS. 5A and B illustrate in cross-section and in a top view, respectively, the second alternative, in which the implantation of the foreign atoms of the second chemical element was performed using an implantation mask only in those regions of the well 2 which are located between the contacts 4. The regions doped using the foreign atoms of the second chemical element are identified by the reference numeral 7.

Figure 6A:
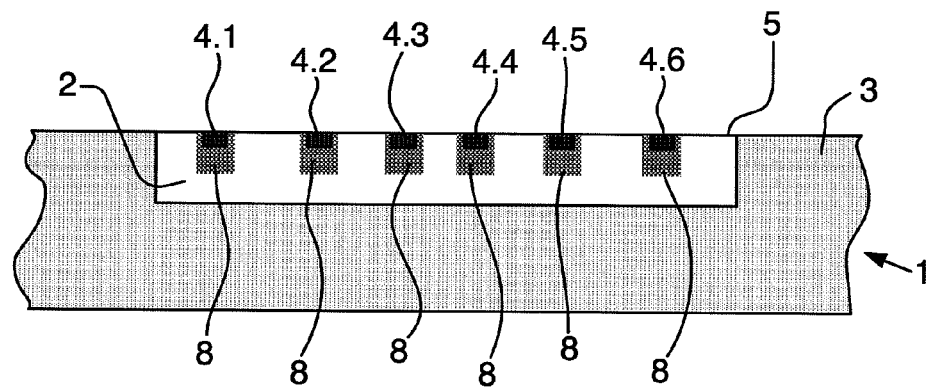
Figure 6B:
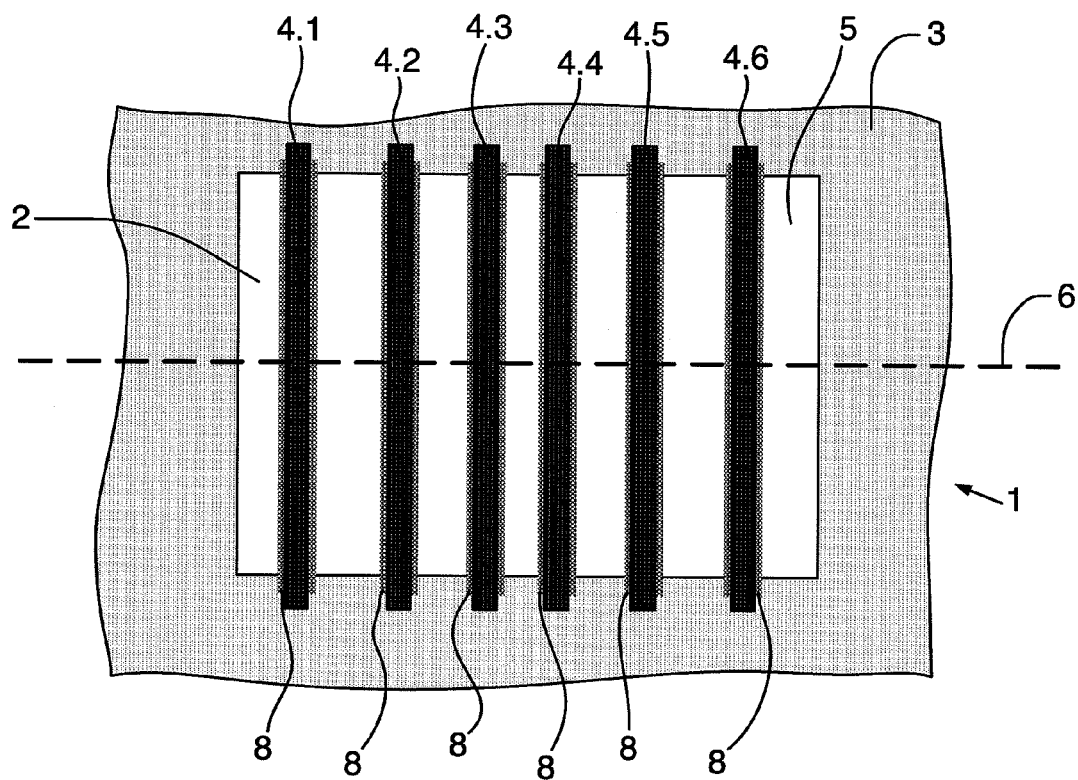

FIGS. 6A and B show in cross-section and a top view, respectively, the doping state of the well 2 after steps A and C, the regions having the foreign atoms implanted in step C being designated by the reference numeral 8.

FIGS. 7A and B show a cross-section and a top view, respectively, of the doping state of the well 2 when all three steps A, B, and C have been performed.

FIG. 8 qualitatively shows the doping profile of the well 2 along line I-I of FIG. 7A. FIG. 9 qualitatively shows the doping profile of the well 2 along line II-II of FIG. 7A. The doping $N_2$ of the foreign atoms at the surface 5 of the well 2, i.e., at the depth D=0, in the areas between the contacts 4, is significantly less than the doping $N_1$ of the example shown in FIG. 3.

A doping profile, which is approximately constant or at least wavy and approximately constant averaged over the waves up to a predetermined depth $T_2$, and then decreases continuously, can also be generated, instead of using the high-energy implantation and relatively long diffusion described in step A, using a method which includes steps A1 and D:

A1) Implanting foreign atoms of a first chemical element into the electrically conductive region 3 of the second conductivity type by means of ion implantation, in which the energy of the ions is either increasingly elevated from a minimum value to a maximum value or is reduced from a maximum value to a minimum value, either in discrete steps or continuously, so that the generated doping profile has multiple maxima or is approximately constant up to a depth $T_{2a}$ from the planar surface 5 of the electrically conductive well 2, and D) electrically activating the implanted foreign atoms by heating.

For example, the minimum value is 1 MeV, the maximum value typically corresponds to 2.5 MeV or the highest possible value which the used ion implanter allows.

FIG. 10 qualitatively shows a doping profile of the well 2 generated according to this method.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A vertical Hall sensor, which is integrated in a semiconductor chip, having an electrically conductive well of a first conductivity type, which is embedded in an electrically conductive region of a second conductivity type, and having electrical contacts, which are arranged along a straight line on a planar surface of the electrically conductive well, which extends parallel to a surface of the semiconductor chip accessible for the wiring, the electrically conductive well having a doping profile generated by ion implantation and not by an epitaxy method, wherein the doping profile either has a maximum which is located at a depth T from the planar surface of the electrically conductive well, or is essentially constant or is wavy and is approximately constant averaged over the waves up to a depth T, with the depth T being T>0.

2. The vertical Hall sensor according to claim 1, wherein the doping of the doping profile is less between the planar surface of the electrically conductive well and the depth T in the areas between the contacts than in the areas below the contacts.

3. The vertical Hall sensor according to claim 1, wherein the doping profile is approximately constant in the areas below the contacts up to the depth T, so that the electrical conductivity in the mentioned areas is greater than in the areas between the contacts.

4. The vertical Hall sensor according to claim 2, wherein the doping profile is approximately constant in the areas below the contacts up to the depth T, so that the electrical conductivity in the mentioned areas is greater than in the areas between the contacts.

5. A method for producing a vertical Hall sensor in a semiconductor chip, which has an electrically conductive well of a first conductivity type, which is embedded in an electrically conductive region of a second conductivity type and has a planar surface, which extends parallel to a surface of the semiconductor chip accessible for the wiring, and has electrical contacts, which are embedded in the planar surface of the electrically conductive well and are arranged along a straight line, wherein the production of the electrically conductive well comprises the following steps:

implanting foreign atoms of a first chemical element in the electrically conductive region of the second conductivity type by means of a high-energy ion implantation in order to generate a doping profile of the foreign atoms which either has a maximum which is located at a depth $T_{1a}$ from the planar surface of the electrically conductive well, the depth $T_{1a}$ being $T_{1a}>0$, or has multiple maxima or is approximately constant up to a depth $T_{2a}$ from the planar surface of the electrically conductive well, the depth $T_{2a}$ being $T_{2a}>0$, and electrically activating the implanted foreign atoms by heating in such a manner that the generated doping profile either has a maximum which is at a depth $T_1 \cong T_{1a}$, or is essentially constant or is wavy and is approximately constant averaged over the waves up to a depth $T_2 \geq T_{2a}$.

6. The method according to claim 5, characterized by the following additional step:

implanting foreign atoms of a second chemical element in the region occupied by the electrically conductive well, in order to reduce the doping and therefore the electrical conductivity directly below the planar surface at least in the regions between the contacts.

7. The method according to claim 5, characterized by the additional step:

implanting foreign atoms of the first chemical element or a third chemical element in the regions occupied by the contacts, in order to increase the doping and therefore the electrical conductivity below the contacts.

8. The method according to claim 6, characterized by the additional step:

implanting foreign atoms of the first chemical element or a third chemical element in the regions occupied by the contacts, in order to increase the doping and therefore the electrical conductivity below the contacts.

* * * * *